United States Patent
Wu et al.

(10) Patent No.: US 6,190,529 B1
(45) Date of Patent: Feb. 20, 2001

(54) METHOD FOR PLATING GOLD TO BOND LEADS ON A SEMICONDUCTOR SUBSTRATE

(75) Inventors: Yei-Shen Wu, Kaohsiung; Kun-Ching Chen, Tainan; Su Tao, Kaohsiung, all of (TW)

(73) Assignee: Advanced Semiconductor Engineering Inc., Kaohsiung (TW)

( * ) Notice: Under 35 U.S.C. 154(b), the term of this patent shall be extended for 0 days.

(21) Appl. No.: 09/294,929

(22) Filed: Apr. 19, 1999

(51) Int. Cl.[7] .............................. C25D 5/02; C25D 7/12; H01L 21/44
(52) U.S. Cl. .................... 205/118; 205/123; 205/157; 438/612; 438/613; 438/686
(58) Field of Search ................................ 438/612, 613, 438/686; 205/118, 123, 157

(56) References Cited

U.S. PATENT DOCUMENTS 5,095,361 * 3/1992 Iwata ....................................... 357/80
5,994,222 * 11/1999 Smith et al. ........................... 438/689

* cited by examiner

Primary Examiner—Edna Wong
(74) Attorney, Agent, or Firm—William E. Pelton, Esq.

(57) ABSTRACT

A method for plating gold to a plurality of bond leads on a substrate is disclosed. The method first extends a plating line from a plating loop on the edge of the substrate to a bond area in the center portion of the substrate to electrically connect the plurality of bond leads in series. The plating line further extends to connect to the plating loop after connecting the plurality of bond leads together. Then, electricity is applied to the plurality of bond leads via the plating loop and the plating line thereby plates gold to the plurality of bond leads. Finally, a bonding tool is used to cut off and remove the plating line when the bonding tool is provided to bond the plurality of bond leads to a die that is attached to the substrate, whereby the residual plating line remaining on the substrate does not affect the performance of the semiconductor chip.

3 Claims, 6 Drawing Sheets

METHOD FOR PLATING GOLD TO BOND LEADS ON A SEMICONDUCTOR SUBSTRATE

BACKGROUND OF THE INVENTION

1. Field of the Invention

The present invention relates to a method for plating gold to bond leads on a semiconductor substrate, more particularly, to a gold plating method which extends a plating line to the bond area of the substrate to electrically connect the bond leads together thereby plating gold thereto.

2. Description of Related Art

In the semiconductor packaging process, the bond lead, which is used to electrically connect a die with a substrate, is usually plated with gold to increase the anti-corrosion and electrical conductivity properties. FIG. 4 shows a conventional arrangement for plating gold to the bond leads (41) on a substrate (40). Each bond lead (41) has one end located at the bond area (42), which is an empty area at the center portion of the substrate (40). The other end of each bond lead (41) is connected with a ball land (43). In order to plate gold to the bond leads (41) and the ball lands (43), a plating loop (44) is provided on the edge of the substrate (40). The plating loop (44) has a plurality of plating lines (441) extended therefrom, each being connected to a bond lead (41) and a corresponding ball land (43). Consequently, the bond leads (41) and ball lands (43) can be plated with gold by conducting electricity thereto via the plating loop (44) and the plating lines (441). When such the gold plating step is completed, as shown in FIG. 5A, the semiconductor packaging process is undertaken by executing a die attachment step, wherein the die (51) is attached to the substrate (40). Then, as shown in FIG. 5B, a cutting and bonding step is processed, wherein a bonding tool (52) is provided to cut off the bond leads (41) (if required) and connect the bond leads (41) to the solder pads (511) on the die (51). Afterwards, as shown in FIG. 5C and 5D, an encapsulation step and a ball mount step are processed to encapsulate the die (51) with encapsulation material (53) and mount a solder ball (54) on each of the ball lands (43). Finally, referring to FIG. 4 and FIG. 5E, a separation step is executed by cutting off the substrate (40) along the separation line (45) thereby producing a packaged semiconductor chip.

As described above, the substrate (40) of the conventional semiconductor chip has a plurality of plating lines (441) extended from the plating loop (44) toward the bond area (42) thereof for plating gold to the bond leads (41) and ball lands (43). Because these extended plating lines (441) are formed on the surface of the substrate (40), the surface area of the substrate (40) that can be used for circuit layout is restricted. Furthermore, when the substrate (40) is cut off along the separation line (45), there are still lots of residual plating lines (441) on the substrate (40). These residual plating lines (441) may cause the packaged semiconductor chip to have bad electrical performance and capacitive crosstalk. An antenna effect is also raised because of the residual plating lines (441) when the packaged semiconductor chip is operated at a high frequency. As a result, the performance of the semiconductor chip can not be promoted. Therefore, there is a need for the above gold plating method to be improved.

SUMMARY OF THE INVENTION

The objective of the present invention is to provide a method for plating gold to a plurality of bond leads on a semiconductor substrate by utilizing a plating line to electrically connect the plurality of bond leads together. The plating line is cut off and removed after the gold plating process is completed so that the residual plating line remaining on the substrate does not affect the performance of a semiconductor chip.

To achieve the objective, the gold plating method in accordance with the present invention first extends a plating line from a plating loop on the edge of the substrate to a bond area in the center portion of the substrate to electrically connect the plurality of bond leads in series. The plating line further extends to connect to the plating loop after connecting the plurality of bond leads together. Then, electricity is applied to the plurality of bond leads via the plating loop and the plating line thereby plating gold to the plurality of bond leads. Finally, a bonding tool is used to cut off and remove the plating line when the bonding tool is provided to bond the plurality of bond leads to a die that is attached to the substrate.

Other objectives, advantages, and novel features of the invention will become more apparent from the following detailed description when taken in conjunction with the accompanying drawings.

DETAILED DESCRIPTION OF THE PREFERRED FMBODIMENT

Figure 1:
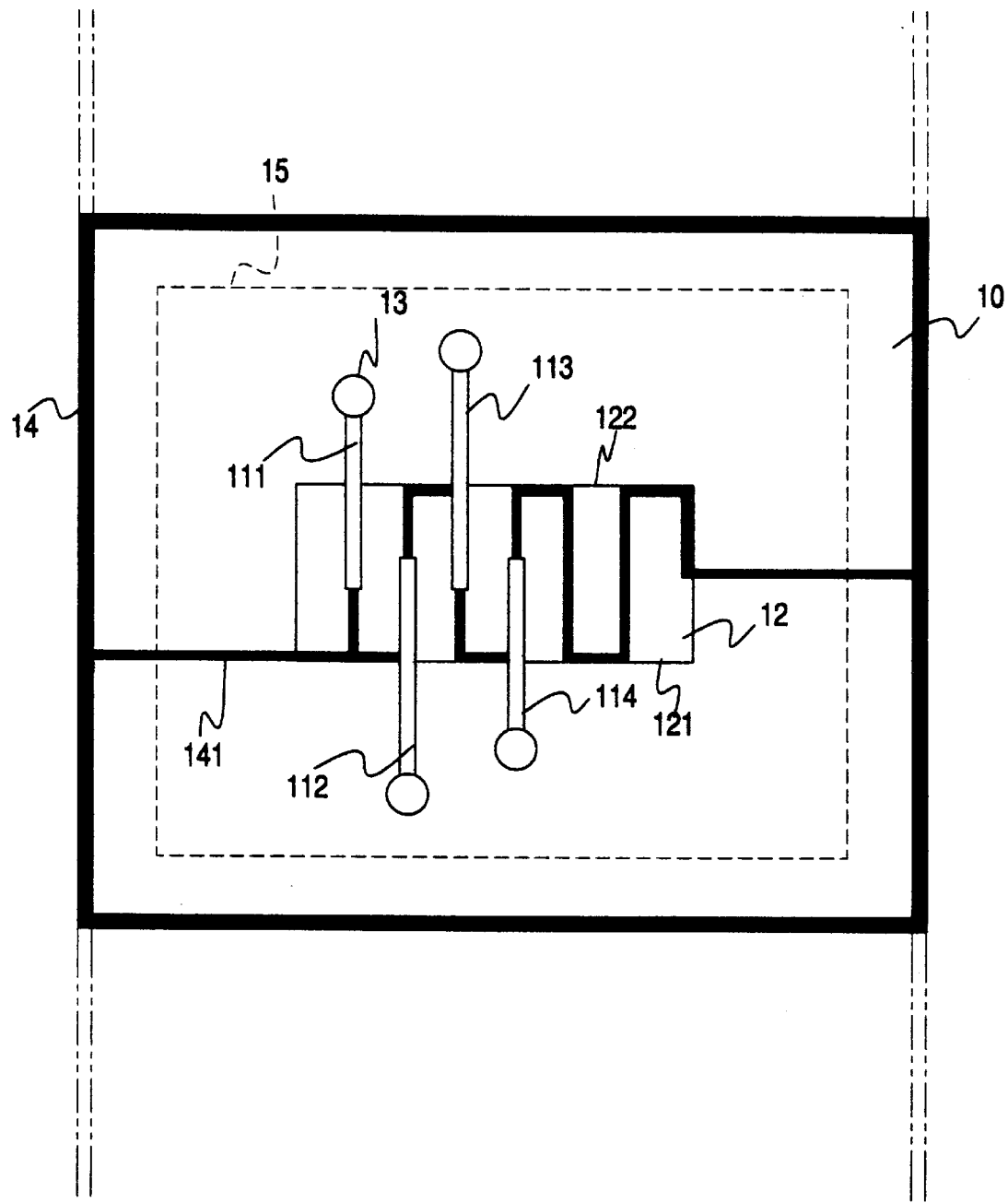
FIG. 1 is a plan view of a substrate using the method for plating gold to bond leads on the substrate in accordance with the present invention.
Figure 2:
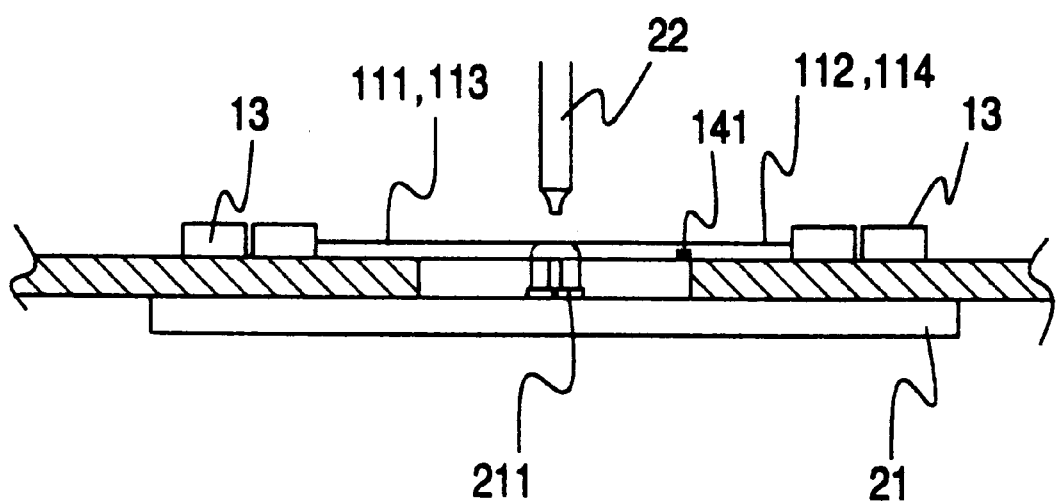
FIG. 2 schematically illustrates that a bonding tool is provided to bond the bond leads to a die and to cut off and remove the plating line used for plating gold to the bond leads in accordance with the present invention.
Figure 3:
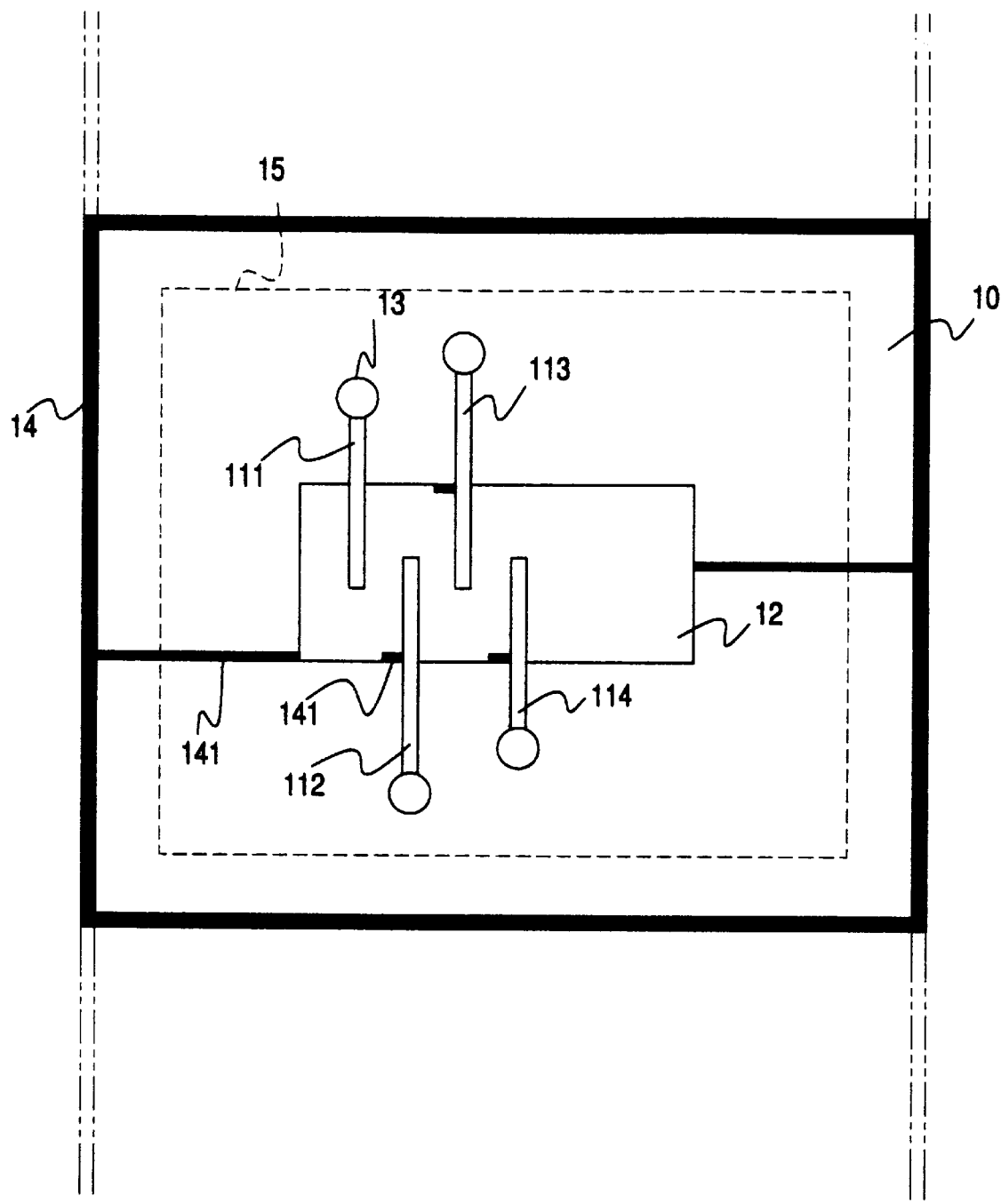
FIG. 3 is a plan view of the substrate whose plating line has been cut off and removed in accordance with the present invention.
Figure 4:
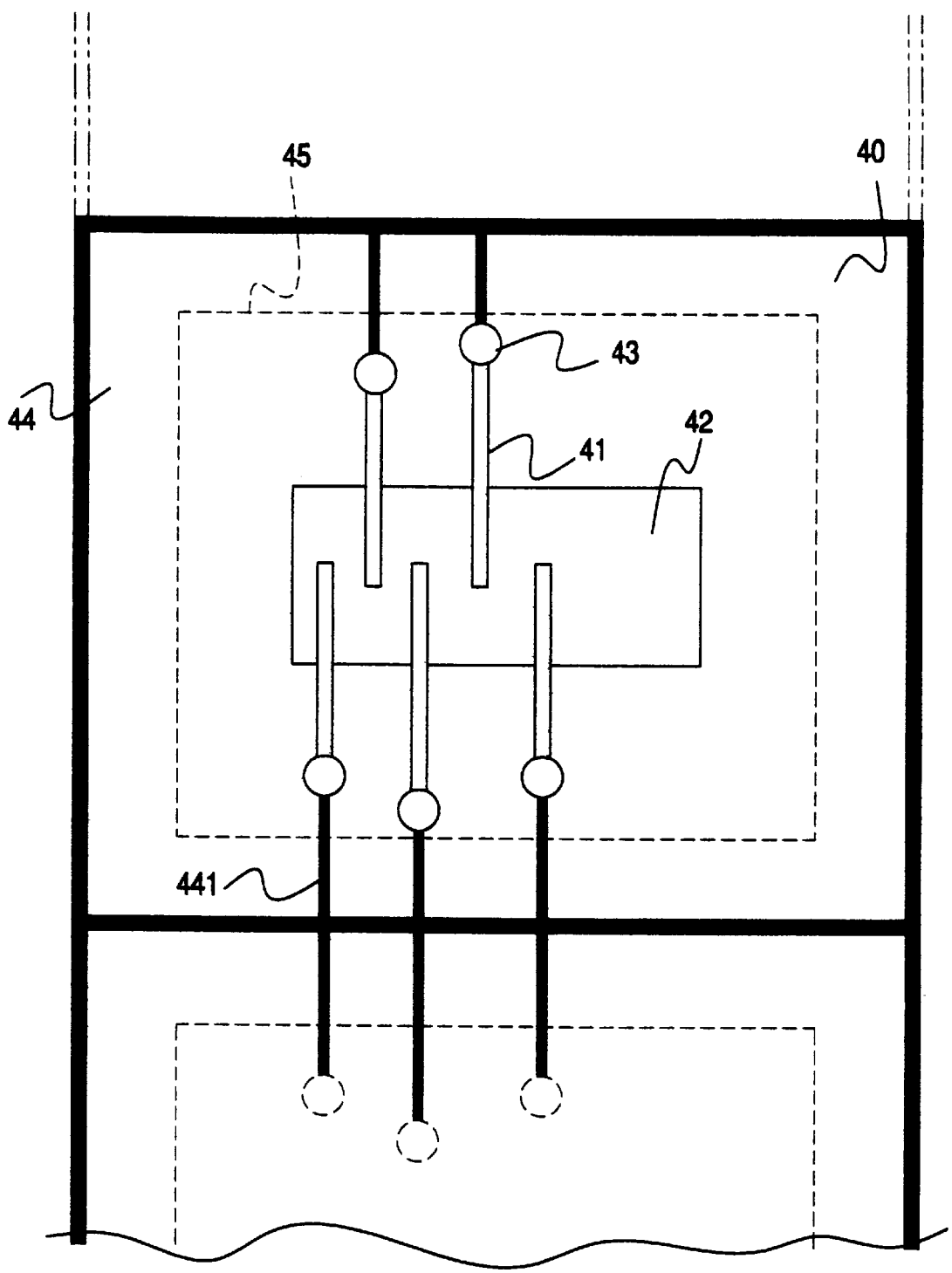
FIG. 4 is a plan view of a substrate using a conventional gold plating method.
Figure 5A:
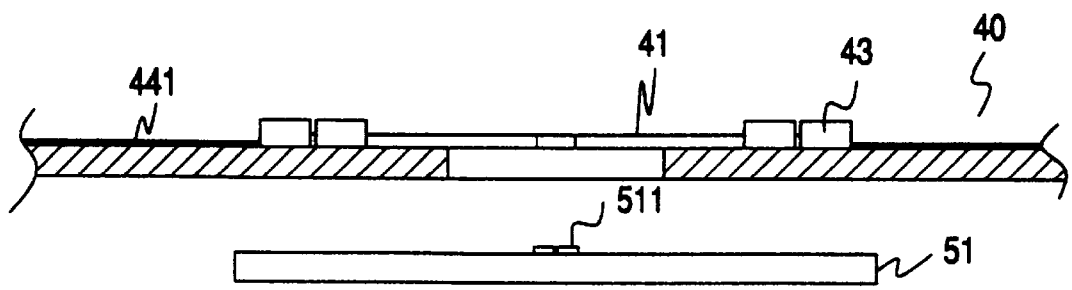
FIG. 5A shows the die attachment step for a conventional semiconductor packaging process.
Figure 5B:
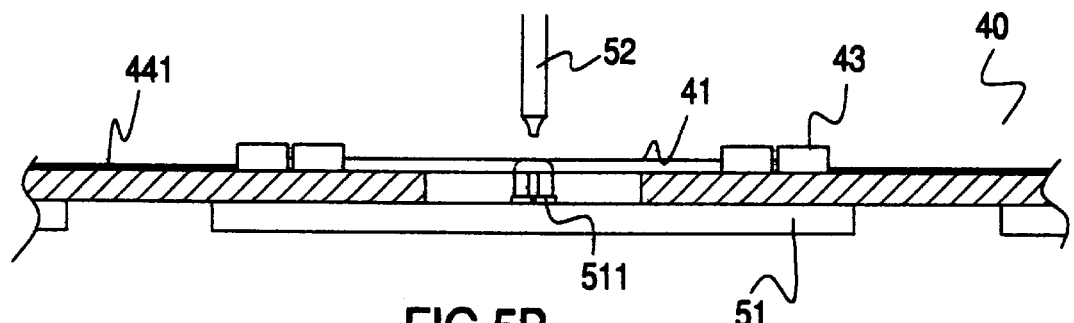
FIG. 5B shows the cutting and bonding step for a conventional semiconductor packaging process.
Figure 5C:
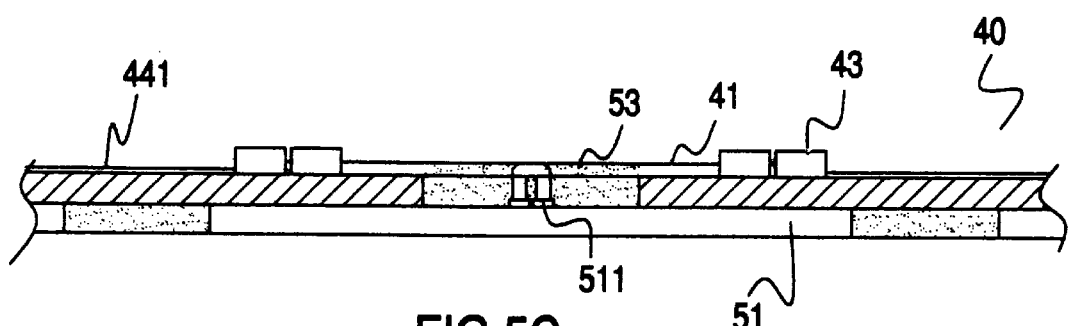
FIG. 5C shows the encapsulation step for a conventional semiconductor packaging process.
Figure 5D:
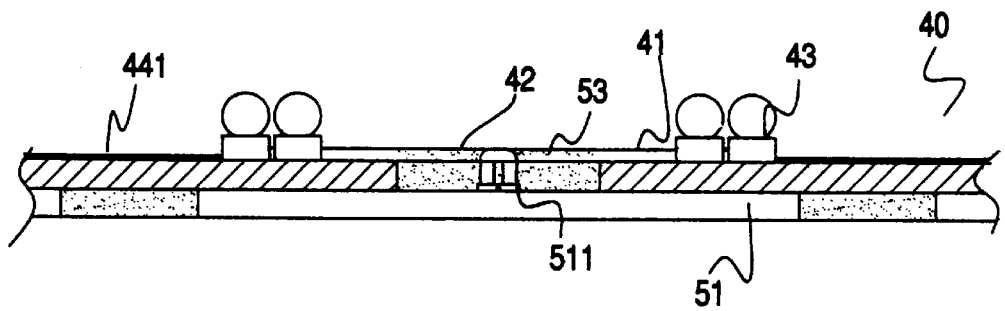
FIG. 5D shows the ball mount step for a conventional semiconductor packaging process.
Figure 5E:
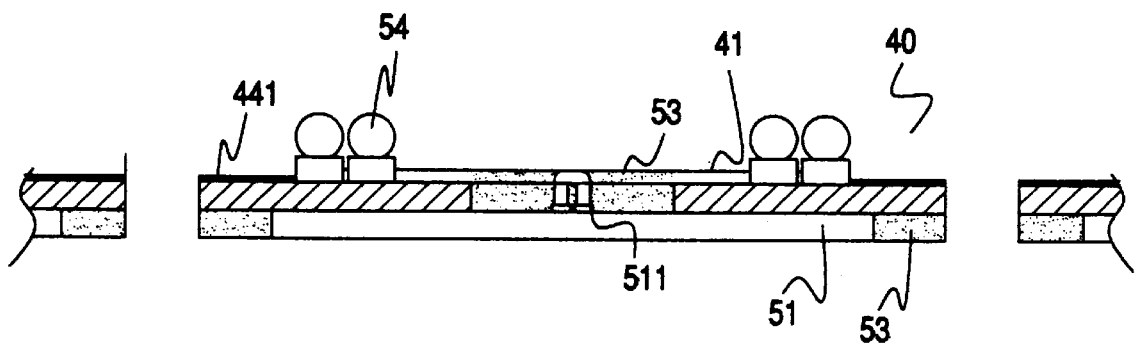
FIG. 5E shows the separation step of a conventional semiconductor packaging process.

FIG. 1 shows a substrate (10) that is used by the gold plating method in accordance with the present invention. A bond area (12) is defined in the center portion of the substrate (10). A plurality of bond leads (111. 112, 113, 114) are provided on the substrate (10) and alternatively arranged on opposite sides of the bond area (12). For the purpose of explanation and illustration, only four bond leads (111, 112. 113, 114) are shown in this preferred embodiment. However, in the actual use, the number of bond leads is much larger than four. Each bond lead (111, 112, 113, 114) has one end located in the bond area (12) and the other end is connected to a ball land (13) for mounting with a solder ball (not shown). A separation line (15) is defined around the outer portion of the substrate (10) so that a packaged semiconductor chip can be easily detached. A plating loop (14) is provided on the edge of the substrate (10). A plating line (141) is extended from the plating loop (14) to the bond area (12). The plating line (141) first extends along the first side (121) of the bond area (12) and connects to the end of the first bond lead (111) and the side of the second bond lead (112). The plating line (141) then extends from the end of the second bond lead (112) to the second side (122) of the bond area (12). Further, the plating line (141) extends along the second side (122) and connects to the side of the third bond lead (113). The plating line (141) then extends from the end of the third bond lead (113) to the first side (121) of the bond area (12) and further extends along the first side (121) and connects to the side of the fourth bond lead (114). Again, the plating line (141 ) then extends from the end of the fourth bond lead (114) to the second side (122) of the bond area (12). With such a layout, the plating line (141) electrically connects all of the bond leads (111, 112, 113, 114) in series. Finally, the plating line (141) connects to the plating loop (14) on the opposite side from where the plating line (141) initially extends With the plating loop (14) and the plating line (141), a conventional electroplating process can be undertaken to plate gold onto the bond leads (111, 112, 113, 114) and ball lands (13). When the electroplating process is completed and the bond leads ( 111, 112, 113, 114) and ball lands (13) have been plated with gold, the semiconductor packaging process is undertaken by first attaching a die to the substrate (10). Then, referring to FIG. 2, a bonding tool (22) is provided to bond and connect the bond leads (111, 112, 113, 114) to the solder pads (211) on the die (21). At the same time, the plating line (141) that connects all the bond leads (111, 112, 113, 114) together is also cut off and removed by the bonding tool (22). FIG. 3 schematically shows the substrate (10) whose plating line (141) has been cut off and removed. It is shown that only a small amount of residual plating line (141) remains on the substrate (10). Afterwards, an encapsulation step and a ball mount step are processed and finally a separation step is executed by cutting the substrate (10) along the separation line (15) thereby producing an individual packaged semiconductor chip. Because the plating line (141) on the substrate (10) of the semiconductor chip is primarily located in the bond area (12), the surface area of the substrate (10) that can be used for circuit layout is not restricted. Furthermore, the plating line ( 141) is cut off and removed when the bond leads (111, 112, 113, 114) are bonded and connected to the die (21) and only a small amount of residual plating line (141) remains on the substrate (10). Therefore, the electrical performance of the semiconductor chip is not affected and no capacitive crosstalk is generated. Even when the semiconductor chip is operated at a high frequency, no antenna effect is present.

Although the present invention has been explained in relation to its preferred embodiment, it is to be understood that many other possible modifications and variations can be made without departing from the spirit and scope of the invention as hereinafter claimed.

What is claimed is:

1. A method for plating gold to a plurality of bond leads on a substrate (10), said substrate (10) having a center portion defined therein a bond area (12) and an edge formed thereon a plating loop (14), each one of said plurality of bond leads having an end located in said bond area (12) and the other end connected with a ball land (13) formed on said substrate (10), a die (21) having a plurality of solder pads (211) being provided to electrically connect with said substrate (10) by bonding said plurality of bond leads to said plurality of solder pads (211), respectively, said method comprising the steps of:

extending a plating line (141) from said plating loop (14) to said bond area (12) to electrically connect said plurality of bond leads in series, said plating line (141) further extending to connect to said plating loop (14) after connecting said plurality of bond leads together;

conducting electricity to said plurality of bond leads and ball lands (13) via said plating loop (14) and said plating line (141) thereby plating gold to said plurality of bond leads and ball lands (13); and using a bonding tool (22) to cut off and remove said plating line (141) when said bonding tool (22) is provided to bond said plurality of bond leads to said plurality of solder pads (211), respectively.

2. The method for plating gold to a plurality of bond leads on a substrate (10) as claimed in claim 1, wherein said plating line (141) connects said plurality of bond leads together by selectively connecting to an end and a side of each bond lead.

3. The method for plating gold to a plurality of bond leads on a substrate (10) as claimed in claim 2, wherein said substrate (10) has an outer portion defined therein a separation line (15).

* * * * *